US006754130B1

(12) United States Patent
Carter

(10) Patent No.: US 6,754,130 B1
(45) Date of Patent: Jun. 22, 2004

(54) MEMORY HAVING MULTIPLE WRITE PORTS AND WRITE INSERT UNIT, AND METHOD OF OPERATION

(75) Inventor: Richard J. Carter, Los Altos, CA (US)

(73) Assignee: Hewlett-Packard Development Company, LP., Houston, TX (US)

(*) Notice: Subject to any disclaimer, the term of this patent is extended or adjusted under 35 U.S.C. 154(b) by 0 days.

(21) Appl. No.: 10/326,405

(22) Filed: Dec. 23, 2002

(51) Int. Cl.[7] .................................................. G11C 8/00
(52) U.S. Cl. .............................. 365/230.05; 365/230.02
(58) Field of Search ....................... 365/230.05, 230.02, 365/189.02, 189.08, 189.05, 189.04

(56) References Cited

U.S. PATENT DOCUMENTS

| | | | |
|---|---|---|---|
| 5,325,504 | A | 6/1994 | Tipley et al. |
| 5,563,829 | A | 10/1996 | Huang |
| 5,923,608 | A | 7/1999 | Payne |
| 5,940,603 | A | 8/1999 | Huang |
| 6,005,794 | A | 12/1999 | Sheffield et al. |
| 6,078,995 | A | 6/2000 | Bewick et al. |
| 6,104,663 | A | 8/2000 | Rablanian |
| 6,212,122 | B1 | 4/2001 | Wen |
| 6,216,205 | B1 | 4/2001 | Chin et al. |
| 6,233,659 | B1 | 5/2001 | Cohen et al. |
| 6,243,294 | B1 | 6/2001 | Rao et al. |
| 6,271,866 | B1 | 8/2001 | Hancock et al. |
| 6,282,143 | B1 | 8/2001 | Zhang et al. |

OTHER PUBLICATIONS

H. Liu et al., Cache, Matrix Multiplication and Vector, Introduction of Cache Memory, Summer 2001, 14 pages.

Smith, A Comparative Study Of Set Associative Memory Mapping Algorithms and Their use For Cache And Main Memory, IEEE: Transactions Of Software Engineering., vol. SE–4., No. 2, Mar. 1978, pp. 121–122 and 129–130.

Maruyama, mLRU Page Replacement Algorithm In Ters Of The Reference Matrix, IBM Technical Disclosure Bulletin, vol. 17, No. 10, Mar. 1975, pp. 3101–3103.

Maruyama, Implementation of the Stack Operation Circuit For LRU Algorithm, IBM Technical Disclosure Bulletin, vol. 19, No. 1, Jun. 1976, pp. 321–325.

Smith, Cache Memories., University of CA., Berkeley, CA, Computing Surveys, vol. 14, No. 3, Sep., 1982, pp. 473–530.

*Primary Examiner*—Michael S. Lebentritt
*Assistant Examiner*—Hien Nguyen

(57) ABSTRACT

Exemplary embodiments of the present invention are directed to providing a memory having N write ports, where N is greater than one. The memory includes a first data memory unit having a plurality of storage locations addressable by a range of addresses, and having less than N write ports. The memory also has a second data memory unit having a plurality of storage locations addressable by the range of addresses, the second data memory unit having less than N write ports. The memory includes a control unit configured to select among the first data memory unit and the second data memory unit in response to a read command having an associated read address which falls within the address range. The control unit includes multiple control memory units, each having less than N write ports. The control unit comprises at least one write-insert unit producing insert data for one of the control memory units, the at least one write-insert unit receiving read data from at least one other control memory unit.

26 Claims, 14 Drawing Sheets

MEMORY HAVING MULTIPLE WRITE PORTS AND WRITE INSERT UNIT, AND METHOD OF OPERATION

RELATED APPLICATIONS

The patent applications MEMORY HAVING MULTIPLE WRITE PORTS AND MULTIPLE CONTROL MEMORY UNITS, AND METHOD OF OPERATION, Carter, Ser. No. 10/326,779 and MEMORY HAVING MULTIPLE WRITE PORTS AND METHOD OF OPERATION, Carter, Ser. No. 10/326,091 are filed concurrently with the present application and incorporated herein by reference.

BACKGROUND

1. Field of the Invention

The present invention relates generally to memory devices, and more particularly, to providing a more capable memory from less capable memory components.

2. Background Information

It is known to combine multiple memory components, such as static random access memory devices, to produce a larger memory array having enhanced capability. For example, smaller memory components can be combined in an array to form a wider memory (i.e., a memory wherein the addressable locations include a larger number of bits). Each of the smaller memory components that form the array have common address and control signals, but have separate data in and data out signals. Alternately, smaller memory components can be combined into an array to form a larger memory of increased depth (i.e., a memory with a large number of addressable locations). Such arrays involve the use of decoders and read data multiplexers. In combining smaller memory components to form a memory array, focus has been on the desired width or depth of the memory array, and the address signals used.

Some design systems allow designers to create a circuit of connected components selected from a design library. The maximum number of write ports on any memory device to be included in the circuit is limited by the memory components available in the design library. For the case of Field Programmable Gate Arrays (FPGAs), the design library includes of the primitive hardware structures of the FPGA (e.g. configurable logic blocks or block RAMs) and any higher-level design elements provided by a “core generator” or other such FPGA design tools. Similarly, for Application Specific Integrated Circuits (ASICs), the design library includes a fixed number of standard-cell or other pre-verified component designs. For these and other technologies, any design that involves a memory with more than the maximum number of write ports supported by the design library is unrealizable in that technology.

SUMMARY OF THE INVENTION

Exemplary embodiments of the present invention are directed to providing a memory having N write ports, where N is greater than one. The memory includes a first data memory unit having a plurality of storage locations addressable by a range of addresses, and having less than N write ports. The memory also has a second data memory unit having a plurality of storage locations addressable by the range of addresses, the second data memory unit having less than N write ports. The memory includes a control unit configured to select among the first data memory unit and the second data memory unit in response to a read command having an associated read address which falls within the address range. The control unit includes multiple control memory units, each having less than N write ports. The control unit comprises at least one write-insert unit producing insert data for one of the control memory units, the at least one write-insert unit receiving read data from at least one other control memory unit.

Exemplary embodiments of the present invention are also directed to a method for operating a memory including providing a memory having N write ports, where N is greater than 1, the memory being constructed from multiple data memory units each having less than N write ports and having a range of addressable storage locations. The method comprises supplying information to an addressable location of the memory which falls within the range of addressable locations, and updating a control memory unit having less than N write ports to indicate which of the multiple data memory units contains the information. The updating includes reading at least one value of at least one control memory unit; determining an insert value from the at least one value of at least one control memory unit; and writing the insert value into a control memory unit.

The present invention is also directed to a control unit for memory having N write ports, where N is greater than 1. The control unit includes a number of control memory units, each control memory unit having less than N write ports. The control unit also includes at least one write-insert unit producing insert data for one of the control memory units, the at least one write-insert unit receiving data read from at least one other control memory unit. The control unit includes at least one select unit receiving read data from the control memory units at a read address provided to the memory, the at least one select unit producing an indication of a data memory unit.

The present invention is further directed to a system having an memory. The system including a memory constructed of multiple data memory units and a control unit. The memory has N write ports, wherein N is greater than 1. The memory includes a first data memory unit having a plurality of storage locations addressable by a range of addresses, and having less than N write ports. The memory includes a second data memory unit having a plurality of storage locations addressable by the range of addresses. The second data memory unit has less than N write ports. The memory includes a control unit configured to select among the first data memory unit and the second data memory unit in response to a read command having an associated read address which falls within the address range. The control unit includes multiple control memory units. Each control memory unit has less than N write ports. The control unit comprises at least one write-insert unit producing insert data for one of the control memory units. The at least one write-insert unit receives read data from at least one other control memory unit. The system also includes logic configured to access the memory.

BRIEF DESCRIPTION OF THE DRAWINGS

Other objects and advantages of the present invention will become apparent to those skilled in the art upon reading the following detailed description of preferred embodiments, in conjunction with the accompanying drawings wherein.

DETAILED DESCRIPTION OF EXEMPLARY EMBODIMENTS

Figure 1:
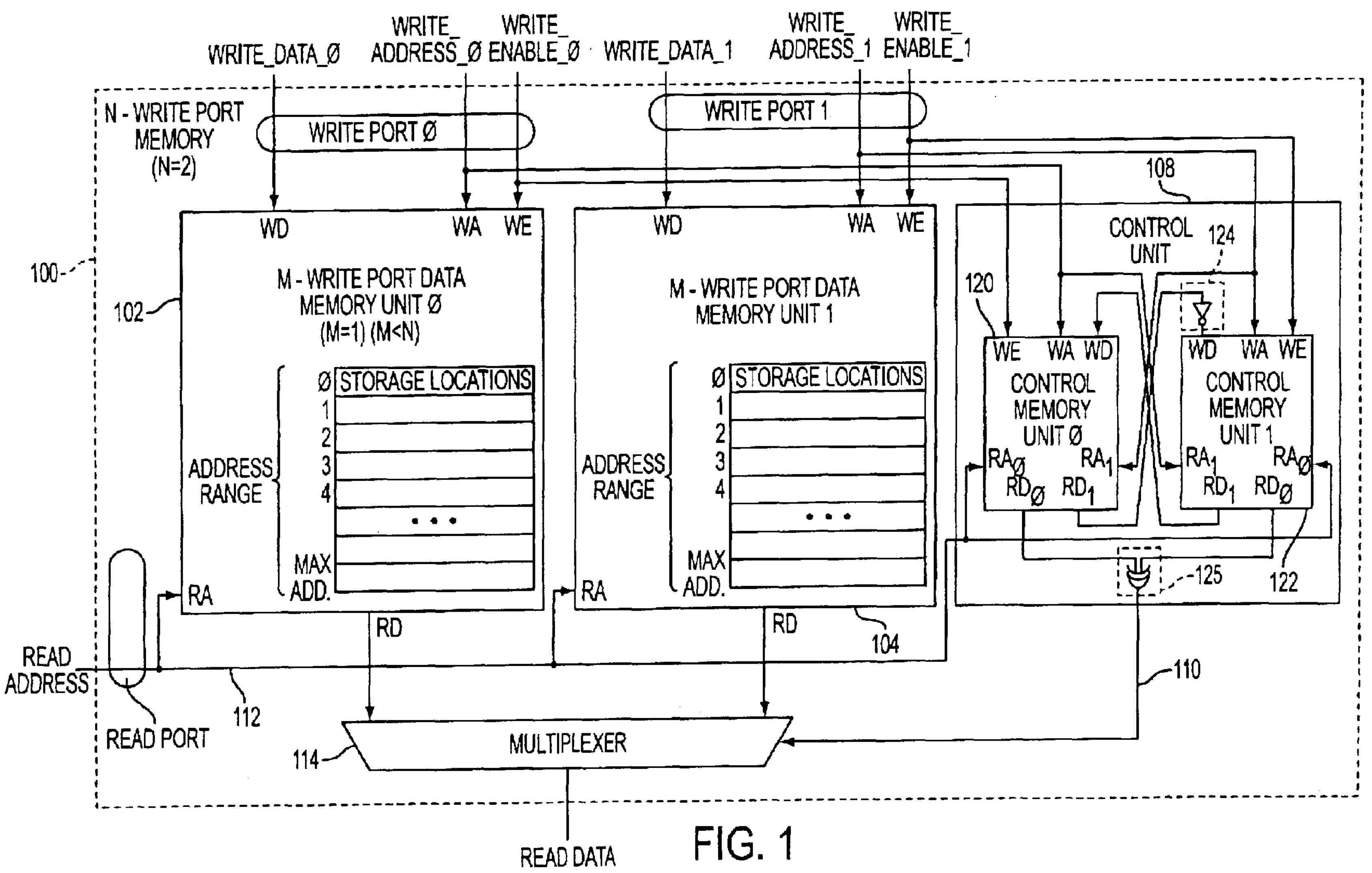
FIG. 1 is a diagram of an exemplary embodiment of the present invention that illustrates a memory constructed of multiple data memory units and a control unit.

In an exemplary embodiment of the present invention, a memory, such as memory 100 of FIG. 1, has N write ports, where N is greater than 1. The memory comprises a first data memory unit, such as data memory unit 102 of FIG. 1, having a plurality of storage locations addressable by a range of addresses; The first data memory unit has less than N write ports. The memory includes a second data memory unit, such as data memory unit 104 of FIG. 1, having a plurality of storage locations addressable by the range of addresses. The second data memory unit has less than N write ports.

The data memory units 102 and 104 can be implemented with any type of memory device, alone or in combination. Examples of memory devices include static memory, dynamic memory, memories operating at a multiple of the system clock frequency, and the like. The memory devices used to create the data memory units can be designed and produced using a design library, such as an FPGA or ASIC design library or the like. The memory 100 can have a greater number of write ports than the maximum number of write ports available for a memory device selectable using the design library.

Multiple memory devices can be combined to increase the width or depth of the data memory units. Multiple memory devices can be combined to form data memory units with an increased number of read ports.

The memory comprises a control unit configured to select among the first data memory unit and the second data memory unit in response to a read command having an associated read address which falls within the address range.

The control unit, such as control unit 108, includes multiple control memory units each having less than N write ports. The control unit functions as a read-modify-write control unit, in that it includes at least one write-insert unit, such as write-insert unit 124 of FIG. 1, for producing insert data for one of the control memory units. The write-insert unit receives read data from at least one other control memory unit.

In the FIG. 1 example, control unit 108 selects among the data memory units 102 and 104 in response to a read command having an associated read address on read address line 112 which falls within the address range of the data memory units 102 and 104.

A write insert unit produces insert data such that a select unit receiving data from each control memory unit for an address will indicate a data memory unit. In the example of FIG. 1, the write insert unit 124 produces data for control memory unit 122 such that data stored in control memory unit 122 and control memory unit 120, when provided to the select unit 125, will indicate the correct data memory unit (e.g., data memory unit 104).

A multiplexer coupled with the first data memory unit and the second data memory unit receives a select memory signal from the control unit and produces read data for the memory. In FIG. 1, the control unit 108 produces a select memory signal that is sent on select line 110 to a multiplexer 114. The read address on read address line 112 is provided to the first data memory unit 102 and the second data memory unit 104. The read data outputs of the first data memory unit 102 and the second data memory unit 104 are provided to the multiplexer. Since the first data memory unit 102 and the second data memory unit 104 have corresponding address ranges, only one of the data memory units 102 or 104 contains the most recently written, thus valid, data. The control unit 108 uses the read address to determine which of the data memory units contains the valid data.

The control unit can be operably connected to the N write ports to receive write addresses and write enables provided to the memory. In FIG. 1, the control unit 108 receives the write address and write enable signals for each write port of the data memory units 102 and 104. The control unit 108 uses this write port information to update control memory units to allow the control unit to determine which data memory unit contains the most recently written, thus valid, data in response to a read address request.

The control unit can comprise a number of control memory units. In the FIG. 1 example, the control unit 108 comprises multiple control memory units represented as control memory unit 120 and control memory unit 122. In an exemplary embodiment, the control memory units 120 and 122 have the same address range as the data memory units 102 and 104.

Each control memory unit can be associated with the write ports of a data memory unit of the memory. Control memory unit 120 is associated with write port '0' and control memory unit 122 is associated with write port '1.'

In accordance with an exemplary embodiment of the present invention, control memory unit 120 is updated using information read from control memory unit 122 when data is written into the memory 100 on write port '0.' Conversely, control memory unit 122 is updated using information read from control memory unit 120 when data is written into the memory 100 on write port '1.'

The control memory units 120 and 122 can be constructed of any type of memory device, alone or in combination, similar to the data memory units described above. The control memory units 120 and 122 shown in the example of FIG. 1 are one bit wide. If three or four data memory units are used in the memory, then two bits can be stored in the control memory units; and if five to eight data memory units are used in the memory, then three bits can be used. However, those skilled in the art will appreciate that any number of data memory units can be used, where each data memory unit is of any fixed or variable bit width.

In the example of FIG. 1, the control unit 108 is configured to identify which of data memory units 102 and 104 contains valid data by producing a select memory signal that is a function of information stored at a common address of the control memory units 120 and 122 during a write cycle to one of the data memory units 102 or 104.

The control unit (e.g., control unit 108) can comprise at least one write insert unit (e.g. write insert unit 124) for producing insert data for one of the control memory units (e.g., control memory unit 120 or 122). The write insert unit (e.g. write insert unit 124) receives read data from at least one other control memory unit.

A "one-hot" representation for the memory select line can be used. In the "one-hot" representation, the output of a single line indicates whether a data memory unit is selected. Alternately, the output of multiple lines can encode the memory select information.

In the FIG. 1 example, a write insert unit 124 associated with the control memory unit 122 receives read data from the control memory unit 120 during a cycle in which a write request is presented to the data memory unit 104 via use of write port '1.' This read data is inserted into control memory unit 122 during the subsequent cycle in which the data memory unit 104 is also written. The read data from the control memory unit 120 is obtained at an address indicated by the write address of write port '1' (the write port associated with control memory unit 122). Control memory unit 120 thus provides read data which is written into the control memory unit 122 at the same address from which the data was read out of control memory unit 120. Conversely, during a write to data memory unit 102 via use of write port '0,' read data from the control memory unit 122 is obtained at an address indicated by the write address of write port '0,' and inserted into control memory unit 120 at the same address from which the data was read out of control memory unit 122.

The control unit can comprise two control memory units, and the control unit can have a single write insert unit. In the example of FIG. 1, the write insert unit is an inverter. For many control unit designs, each control memory unit has an associated write insert unit. In FIG. 1, data inserted into the control memory units is used by the control unit to determine how to select among the first and second data memory units by identifying whether data memory unit 102 or data memory unit 104 has valid data at a given address. In one example, data stored at the same address in control memory unit 120 and control memory unit 122 is examined and used to indicate which data memory unit has the most recently written data at that address.

In the FIG. 1 example, if the stored data at an address in both control memory unit 120 and control memory unit 122 are the same, then data memory unit '0' is indicated. If the stored data at the address in control memory unit 122 is different from the stored data at the address in the control memory unit 122, then data memory unit '1' is indicated. When data is written into the memory on write port '1,' the write insert unit 124 ensures that the stored data for the address in control memory unit 122 is different from the stored data at the same address of control memory unit 120. When data is written into the memory on write port '0' for an address, data read from control memory unit 122 at that write address is copied into the control memory unit 120 to ensure a match of the stored data at that address in control memory units 120 and 122.

Figure 2:
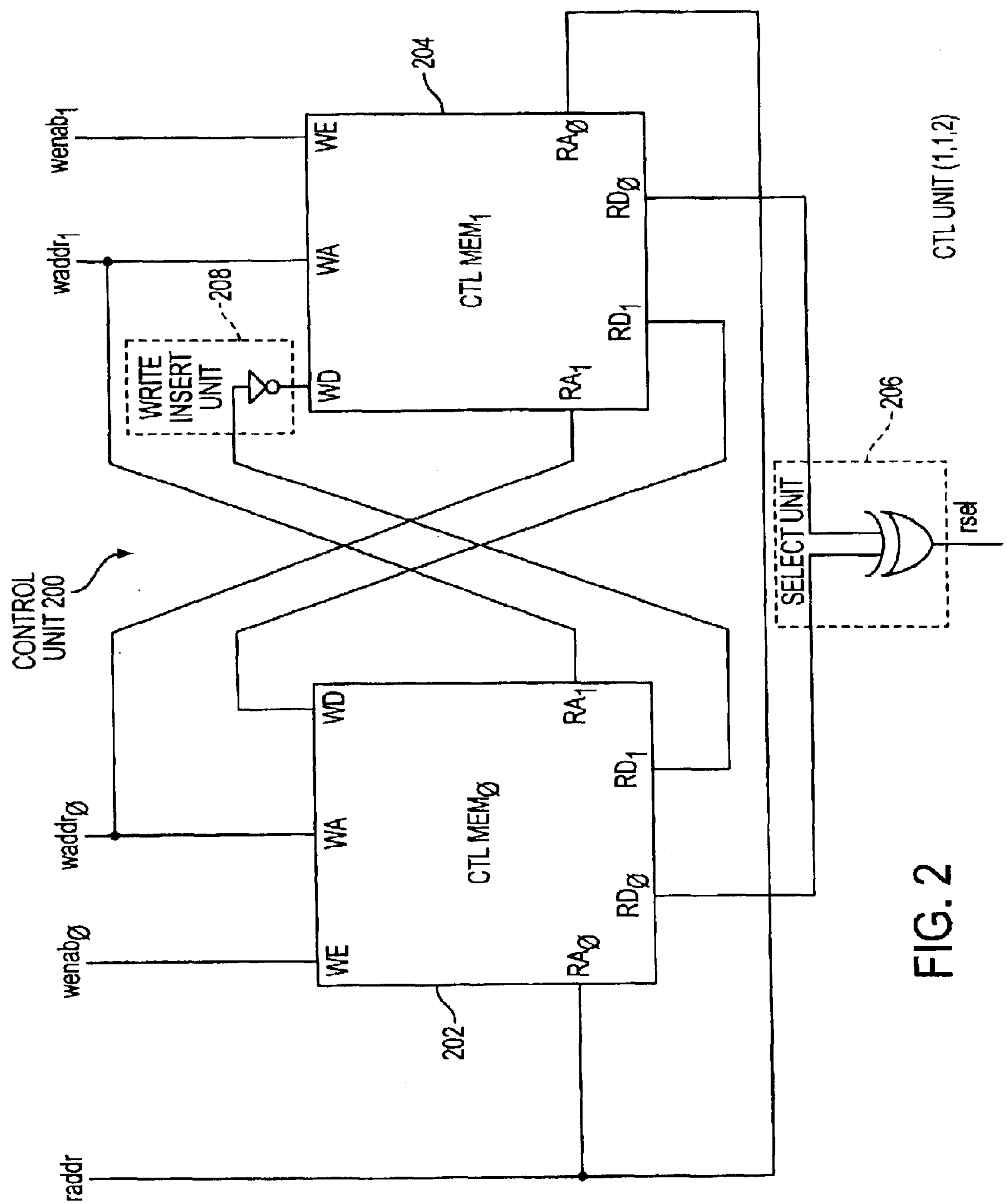
FIG. 2 is a diagram that illustrates a control unit of an exemplary embodiment of the system of the present invention.

FIG. 2 is a diagram that illustrates an exemplary control unit of an exemplary embodiment of the present invention. As a matter of definition, a control unit that operates within a memory that has R read ports, X data memory units and where each data memory unit has W write ports will be termed a CtlUnit(R,W,X). Using this terminology, FIG. 2 depicts a CtlUnit(1,1,2).

In an exemplary embodiment of the present invention, the control unit comprises at least one select unit receiving read data from the control memory units at the associated read address, the at least one select unit producing a select memory signal.

In the example of FIG. 2, read data from the control memory unit 202 and the control memory unit 204 is provided to the select unit 206. The select unit 206 is logic that produces a select memory signal based on the stored data in the control memory units 202 and 204 for a given address. In the example of FIG. 2, the select unit comprises an Exclusive-OR unit which produces a '0' output indicating data memory unit '0' when the stored data at the associated read address of the control memory units 202 and 204 match, and produces a '1' indicating data memory unit '1' when the stored data at the associated read address are different. The select unit 206 thus includes logic that produces the select memory signal based upon the encoding of the information in the control memory units. The operation of the write insert unit 208 is linked to the operation of the select unit 206.

In the examples of FIGS. 1 and 2, the number of write ports of the constructed memory 100, to be referred to as N, is 2 (i.e. N=2). The control unit 200 shown in FIG. 2 is such that the control memory units require less than N write ports. Each of the control memory units 202 and 204 of the FIG. 2 example uses a single write port. As such, the control memory units 202 and 204 of FIG. 2 can be constructed using a design library that allows only the use of memory devices with M write ports or less, where M<N. FIGS. 1 and 2 show a two-write-port memory (N=2) constructed from one-write-port memory devices (M=1). The memory of FIGS. 1 and 2 can be implemented in a field-programmable gate array (FPGA) that would otherwise not allow for multiple-write-port memory devices.

The constructed memory can have more than one read port. In that case, the control unit can have a select unit associated with each read port.

Figure 3:
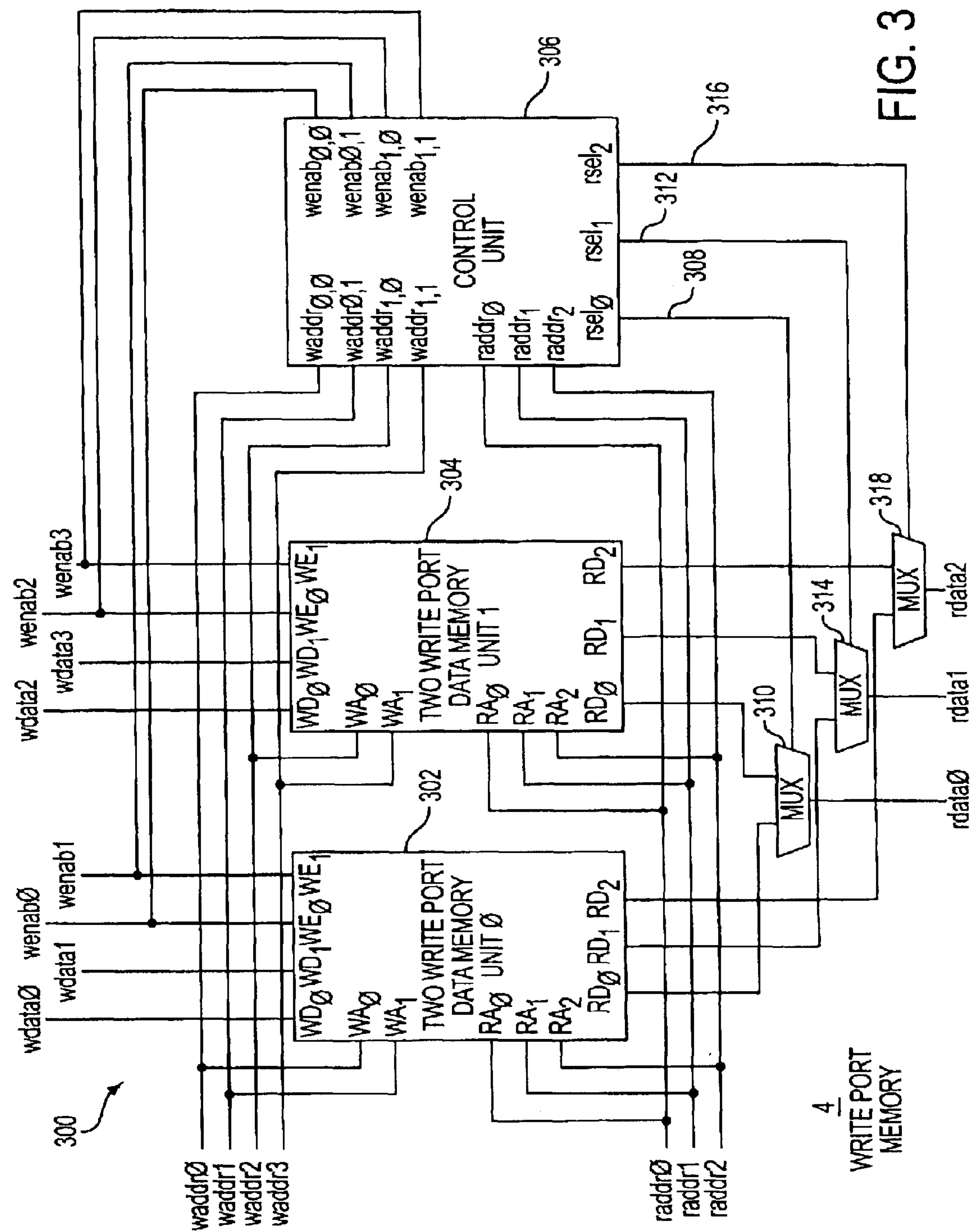
FIG. 3 is a diagram that illustrates an exemplary embodiment of a memory of the present invention that has multiple read lines constructed from component memories that each have multiple write ports.

FIG. 3 illustrates an exemplary memory 300 of an exemplary embodiment having data memory units 302 and 304. The data memory units 302 and 304 are two-write-port data memory units, such that memory 300 is a four-write-port memory. The data memory units 302 and 304 each have 3 read ports, such that memory 300 is also a three-read-port memory. The control unit 306 can be used to produce a select memory signal on select line 308 that is provided to the multiplexer 310. The control unit 306 is also used to produce a select memory signal on select line 312, which is provided to the multiplexer 314. The control unit 306 can also be used to produce a select memory signal on select line 316, which is provided to the multiplexer 318.

Figure 4:
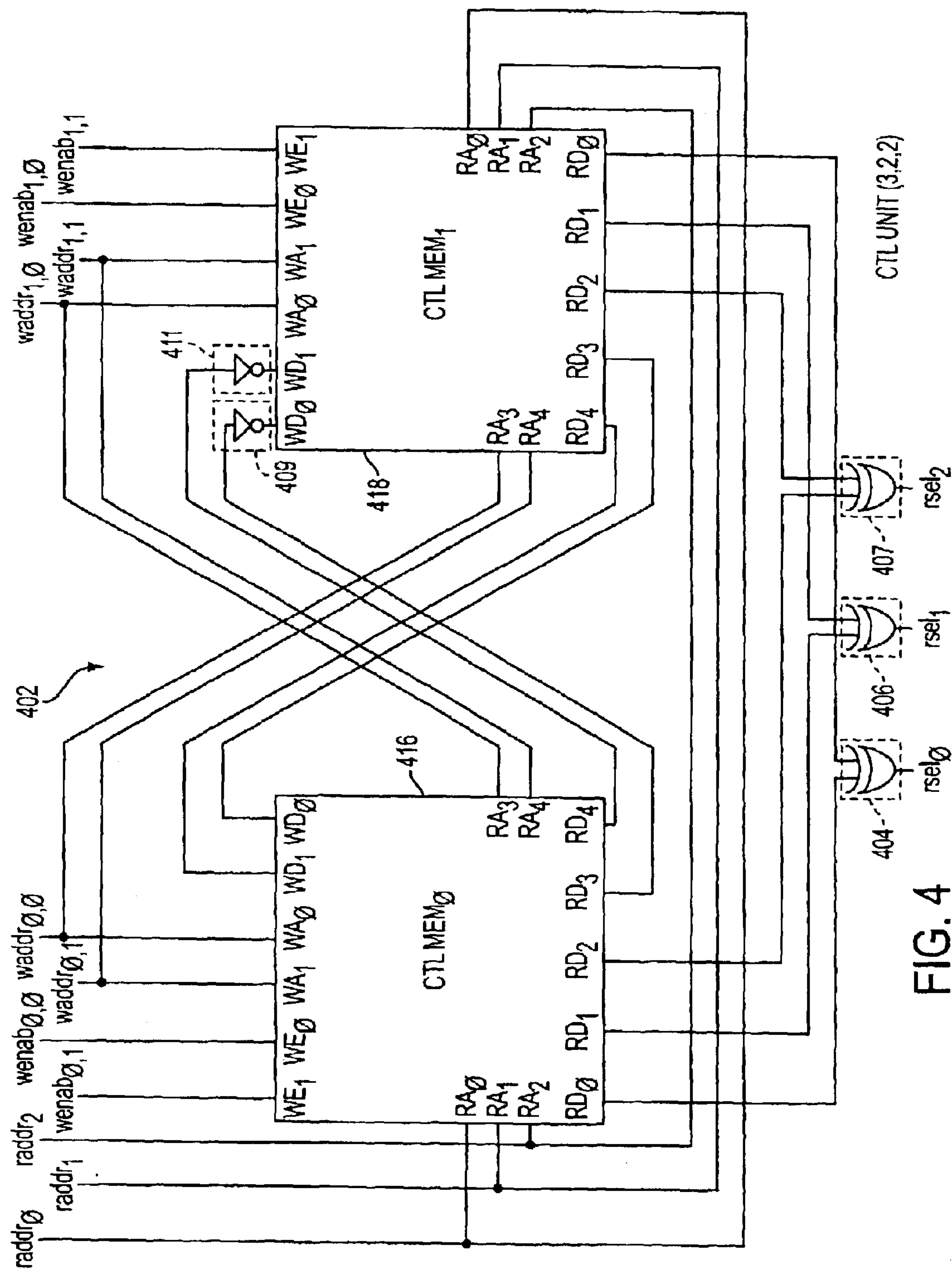
FIG. 4 is a diagram that illustrates an exemplary embodiment of the control unit for the memory of FIG. 3.

FIG. 4 illustrates an exemplary control unit 402 for the memory example of FIG. 3 that includes multiple select units, represented as select unit 404, select unit 406 and select unit 407. The memory includes three read ports, select unit 404 being associated with the read port '0,' select unit

406 being associated with the read port '1' and select unit 407 being associated with read port '2.' The select unit outputs are sent to multiplexers to select between the read outputs of the data memory units.

The select units 404 and 406 and 407 can be implemented as Exclusive-OR units that receive data from the control memory units 416 and 418.

In the example of FIG. 4, the control unit 402 is used to combine two 2-write-port 3-read-port data memory units to form a 4-write-port 3-read-port memory. Control memory units 416 and 418 use three read ports to provide the read data to the select units 404, 406, and 407 and two read ports to provide the read data which is used to determine the write insert data. Each of the control memory units 416 and 418 includes five read ports. Should it be the case that the component design library memories used to construct the control memory units have fewer than five read ports, the design library memories can be combined to create a memory with the required five read ports. Such a read port expansion can include replicated memory devices with the same write port connections and different read port connections. The replicated memory devices allow for duplicate memory storage such that data can be read out of any of the replicated memory devices.

In the example of FIG. 4, two write ports are used for each control memory unit. Write insert units 409 and 411 are used to invert the read data for two write ports.

In an exemplary embodiment of the invention, the memory includes a first data memory unit, a second data memory unit, and at least one additional data memory unit, and a control unit adapted to select between the first data memory unit, the second data memory unit, and the at least one additional data memory unit.

Figure 5:
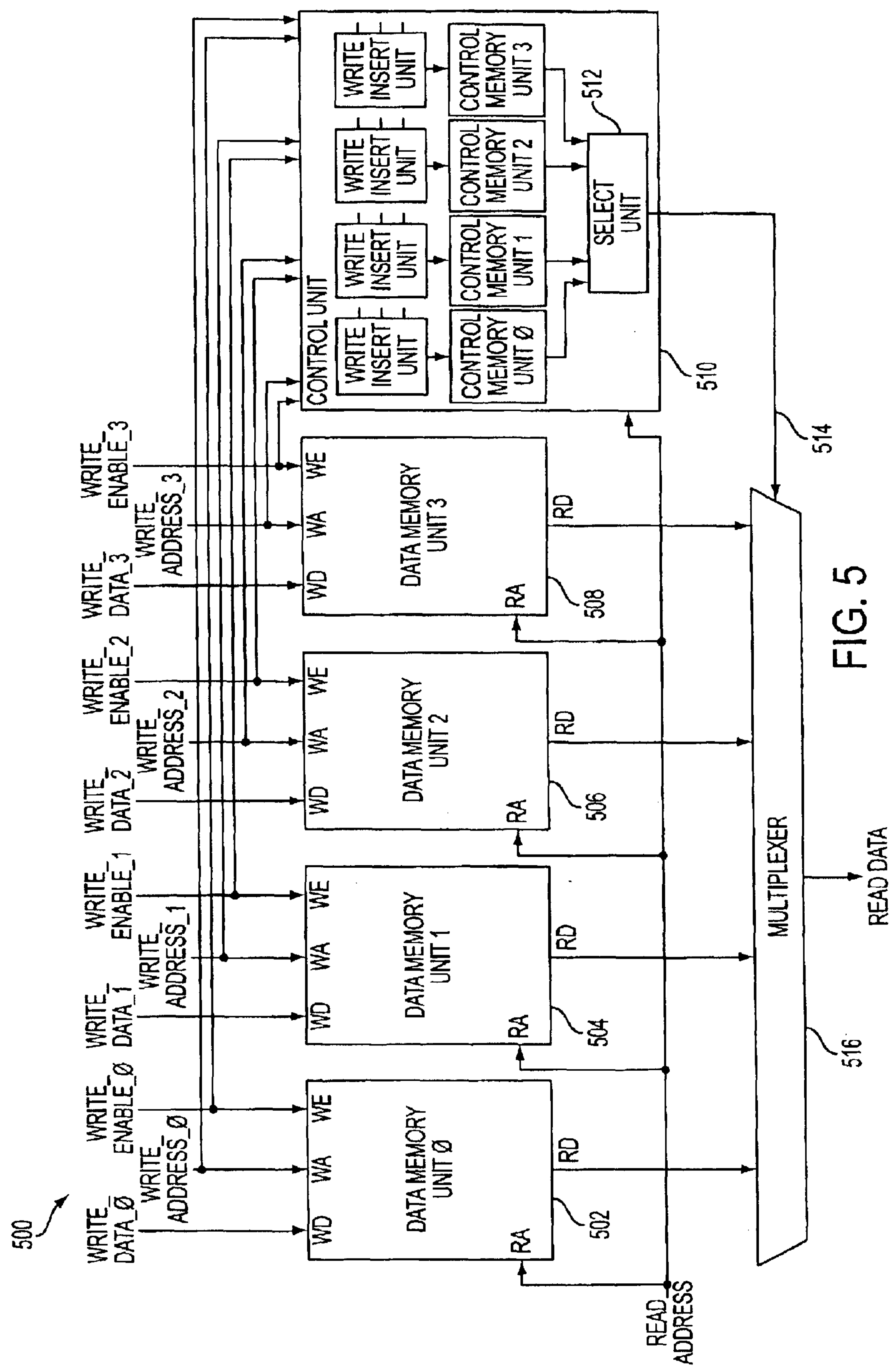
FIG. 5 is a diagram that illustrates an exemplary memory with four data memory units of an exemplary embodiment of the present invention.

In the example of FIG. 5, memory 500 has four data memory units 502, 504, 506 and 508. Each of the data memory units 502, 504, 506 and 508 includes a single write port. The control unit 510 includes four control memory units. Whenever data is written into one of the data memory units 502, 504, 506 or 508, a control memory unit corresponding to that write port is modified by a write insert unit. In an exemplary embodiment, the write insert unit receives data from each of the other control memory units.

A select unit 512 receives data from a location in each of the control memory units, the location being associated with a given read address. The select unit 512 uses this data to construct a select memory signal on select memory line 514, which is provided to the multiplexer 516. In the example of FIG. 5, data memory unit 502 is given the identifier '0', data memory unit 504 is given the identifier '1,' data memory unit 506 is given the identifier '2,' and data memory unit 508 is given the identifier '3.' In an exemplary embodiment, since there are four data memory units, each of the control memory units stores two bits of data for each address location and the select memory signal is a two-bit signal. Each of the write insert units receives the two-bit data from each of the other control memory units and calculates a two-bit insert value which, when combined in select unit 512 with the other data stored in the other control memory units for that address, produces a select memory signal indicating the correct data memory unit.

Figure 6:
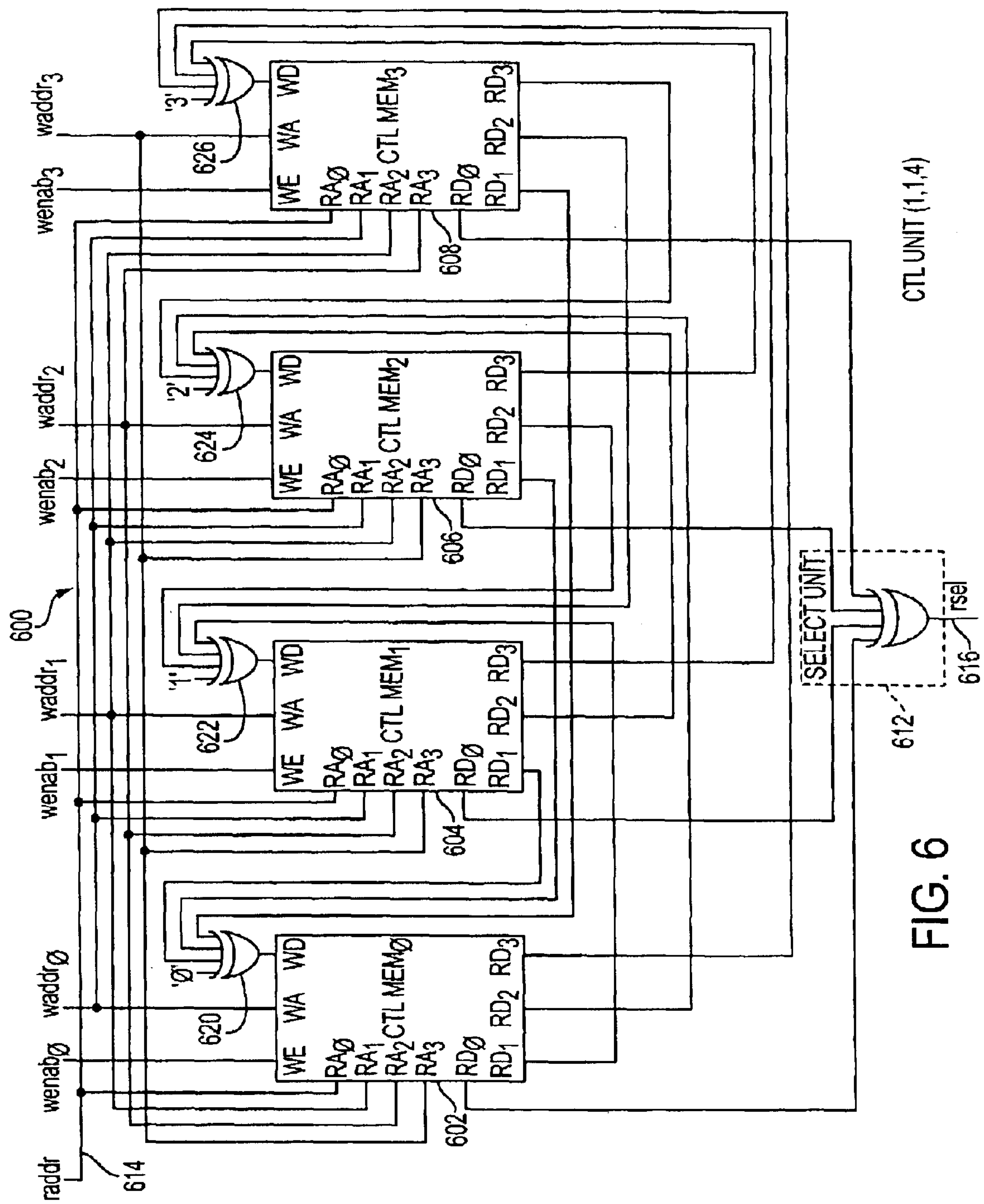
FIG. 6 is a diagram that illustrates an exemplary control unit for the memory of FIG. 5.

The select unit can include Exclusive-OR logic. In FIG. 6, the select unit 612 includes Exclusive-OR logic. In an exemplary embodiment, the write insert unit uses Exclusive-OR logic. Write insert units 620, 622, 624 and 626 include Exclusive-OR logic.

In an exemplary embodiment, the Exclusive-OR logic of a write insert unit receives read data from each of the control memory units other than the control memory unit to which the write insert unit output is connected. In the FIG. 6 example, write insert unit 620 receives inputs from control memory units 604, 606 and 608, which are all of the control memory units in the control unit except for control memory unit 602 that is connected to the write insert unit 620.

An identifier constant value can be provided to the Exclusive-OR logic of the write insert unit. Write insert unit 620 has a constant '0' as an input; write insert unit 622 has a constant '1' as an input; write insert unit 624 has a constant '2' as an input; and write insert unit 626 has a constant '3' as an input. The identifier constant inputs ensure that the select unit outputs identify the correct data memory unit.

FIG. 6 illustrates an example of a control unit for use with the memory of FIG. 5. In FIG. 6, the control unit 600 includes a number of control memory units 602, 604, 606 and 608. A read address on read address line 614 is provided to each of the control memory units 602, 604, 606 and 608. Each of the control memory units 602, 604, 606 and 608 provides read data to a select unit 612, which produces a select memory signal on select line 616. The write insert units 620, 622, 624, and 626 each receive data from three control memory units and produce insert data that is written to the remaining control unit.

The write insert units for the example of FIGS. 5 and 6 can be implemented using Exclusive-OR logic or any other logic. The write insert units have an identifier input to identify the data memory unit of the memory of FIG. 5. For the example of FIGS. 5 and 6, the read data multiplexer, control memory units, write insert units, and select units can operate on two bits of data, which allow the selection of one of four data memory units. Using such a two-bit "encoded" data representation, the data memory and write insert identifiers '0,' '1,' '2' and '3' can be represented in binary as '00,' '01', '10' and '11' respectively. In an alternate embodiment still depicted by FIGS. 5 and 6, the read data multiplexer, control memory units, write insert units, and select units can operate on four bits of data, which allow the selection of one of four data memory units. Using such a four-bit "one-hot" data representation, the data memory and write insert identifiers '0,' '1,' '2' and '3' can be represented in binary as '0001,' '0010,' '0100' and '1000' respectively.

Figure 7:
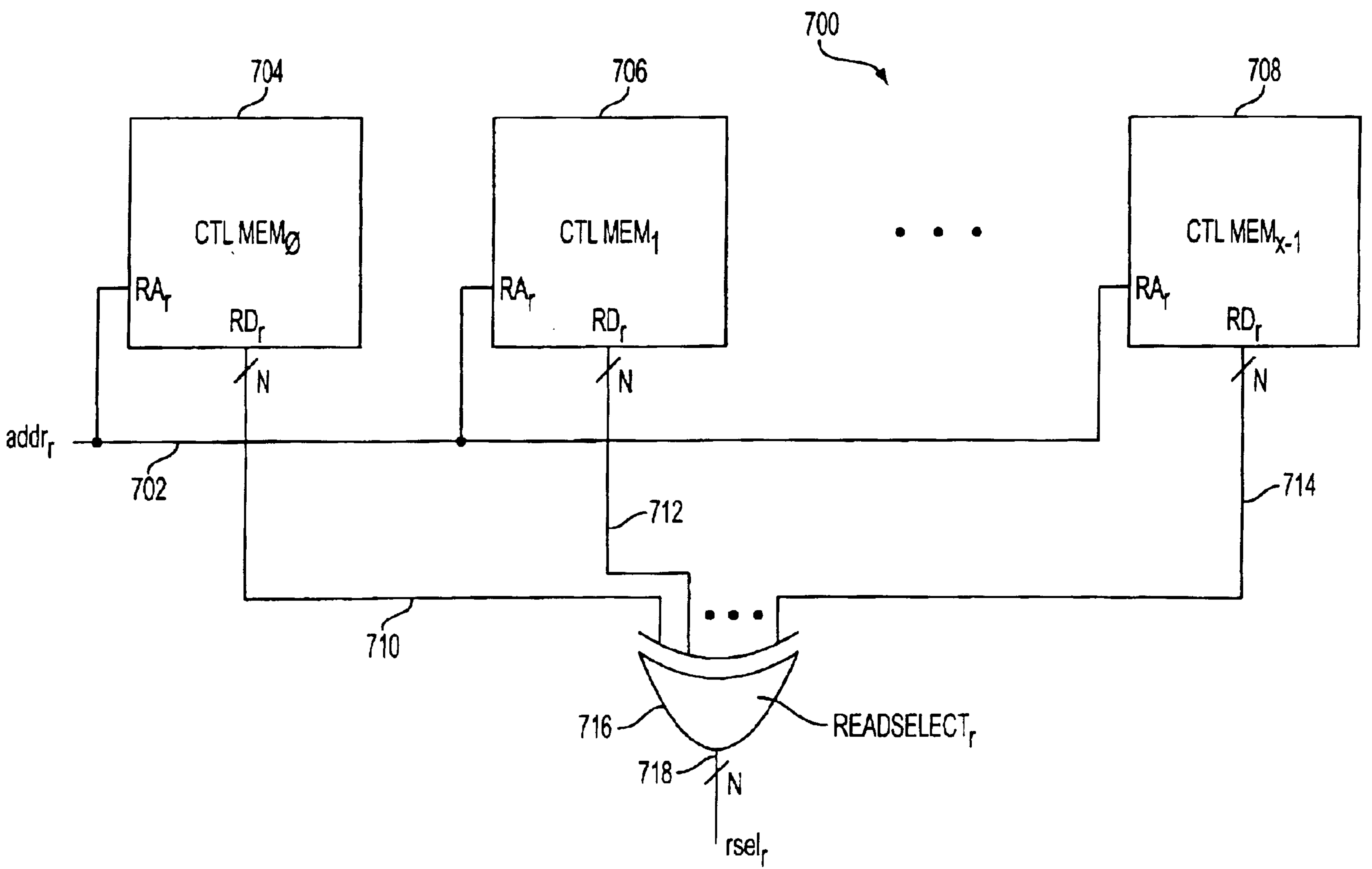
FIG. 7 is a diagram that illustrates signal connections to a select unit for an exemplary embodiment of the present invention.

FIG. 7 illustrates a partial view of an exemplary control unit showing only those signal connections that drive a select read output. In this example, the address on line 702 is sent to the control memories including control memory 704, control memory 706 and control memory 708. The read address causes data to be output from the control memories on a number of read data lines, including read data line 710, read data line 712, and read data line 714. The output data is sent to the read select unit 716. In this case, the read select unit is implemented as an Exclusive-OR unit. By Exclusive-ORing the outputs from each of the control memory units, the data on the read select line 718, indicates the selected data memory unit. In this example, N bits of data are used, which allow the selection of up to $2^N$ data memory units.

Figure 8:
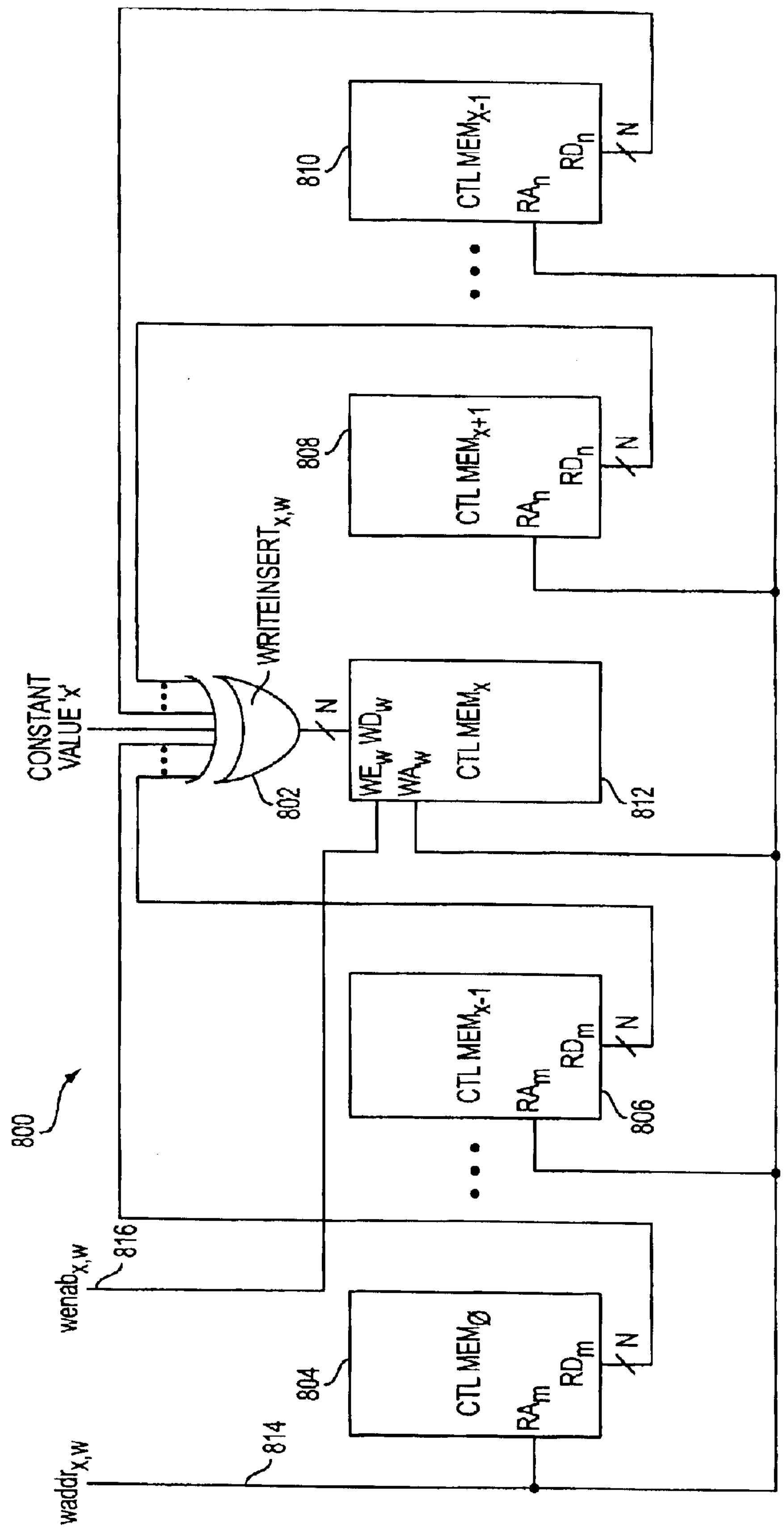
FIG. 8 is a diagram that illustrates signal connections to a write insert unit for a control unit of an exemplary embodiment of the present invention.

FIG. 8 illustrates the writing of data into a control memory unit in an exemplary embodiment. In this example, a write port of the data memory unit numbered 'x', comprising write address signal 814 and write enable signal 816, drives a write port of control memory unit 812, also numbered 'x.' The corresponding write data input of the write port of control memory unit 812 is driven by the output of write insert unit 802. The output of the write insert unit 802 is written into the location addressed by write address 814 when the write enable line 816 is asserted. Write insert unit 802 receives read data from all control memory units other than control memory unit 812, including control memory units 804, 806, 808 and 810. The write address 814 is used as a read address for each of the control memory units other than 812, including control memory units 804, 806, 808 and 810. The data at that address is provided to the write insert unit 802. All of these values are Exclusive-ORed together along with a constant value 'x'; constant value 'x' indicating the data memory unit that will contain the most recent data for the location addressed by write address 814 once that write operation is completed.

Figure 9:
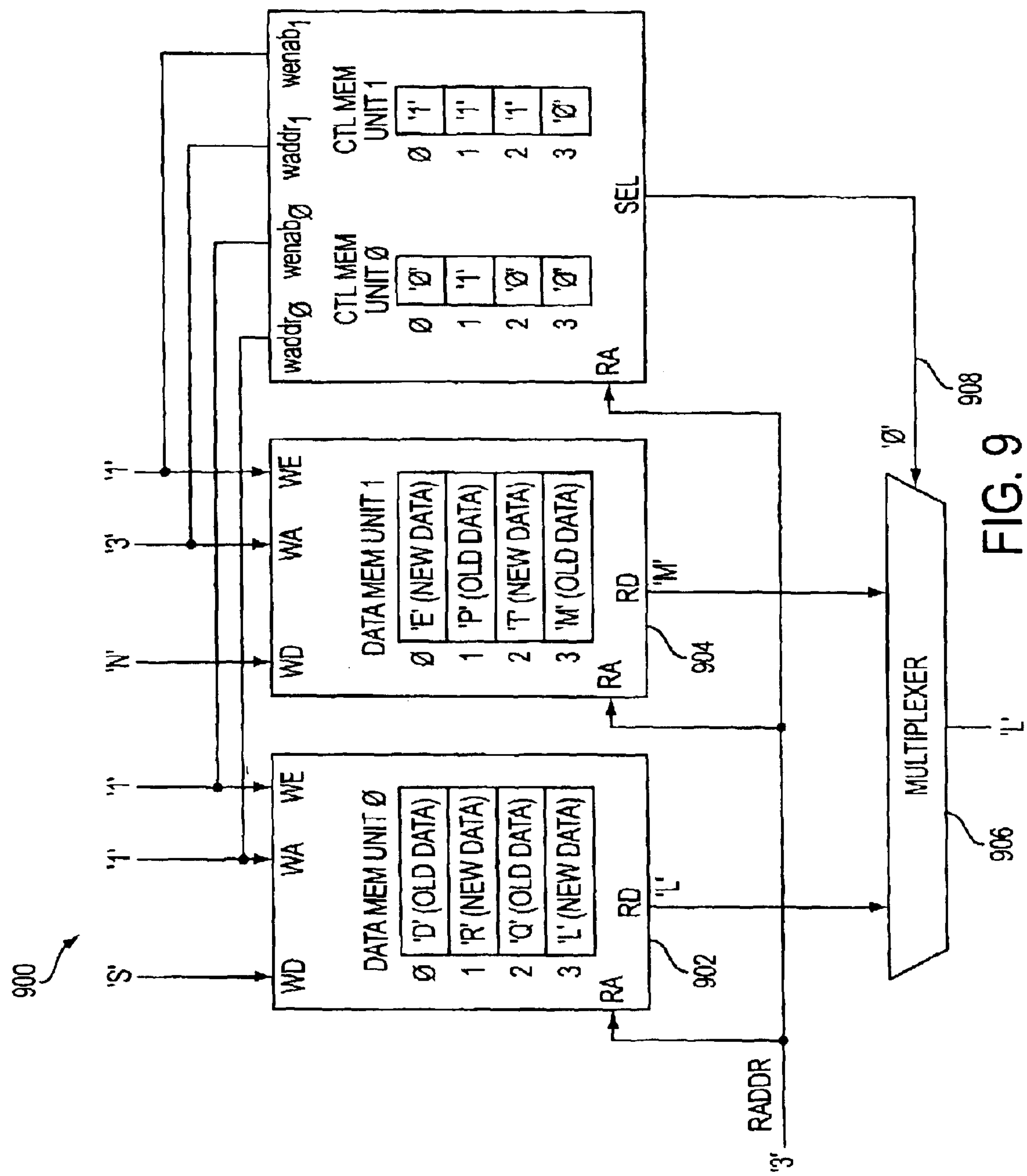
FIGS. 9 and 10 are simplified diagrams that illustrate an example of the state of a memory of FIG. 1.

FIG. 9 illustrates an exemplary read operation of a memory 900. In the exemplary embodiment of FIG. 9, data memory unit 902 and data memory unit 904 each have one write port and are combined to produce a memory 900 with two write ports. For purposes of illustration, memory 900 contains four memory locations. Data memory units 902 and 904 either contain the new data or old data for each of the four locations. The new data, that being the data most recently written to a given address, is the data that should be returned by memory 900 in response to a read operation targeting that address. In the example of FIG. 9, the read address on read address line is '3.' The data memory unit 902 supplies the data 'L' to the multiplexer 906, and the data memory unit 904 supplies the data 'M' to the multiplexer 906. Control memory unit '0' contains a '0' for address '3.' Control memory unit '1' also contains a '0' for address '3.' A select unit combines the read data from the control memory units '0' and '1.' The select unit Exclusive-OR's '0' with '0' to form the select memory signal '0.' The multiplexer 906 selects data 'L' as the read data output of the entire memory.

Further, in the example of FIG. 9, the data'S' is requested to be written into address '1' of data memory unit 902. The data 'N' is requested to be written into address '3' of data memory unit 904. The contents of address '1' of data memory unit 902 already contain new data, but the contents of address '3' of memory 904 contain old data.

In preparation for the write operations, which take place after a clock signal is asserted, the control unit reads certain data values from the control memory units. For address '1,' the control unit reads the value of address '1' in control memory unit '1' which is, in this case, a '1.' A'1' is prepared to be written into control memory unit '0' at this address, without an inversion. For address '3,' the read data from control memory unit '0' is inverted to produce the insert value for control memory unit '1,' in this case a'1.' For address '1,' the control unit reads the value of address '1' in control memory unit '1' which is, in this case, a'1.' A '1' is prepared to be written into control memory unit '0' at this address, without an inversion. For address '3' the read data from control memory unit '0' is inverted to produce the insert value for control memory unit '1,' in this case a '1.'

Figure 10:
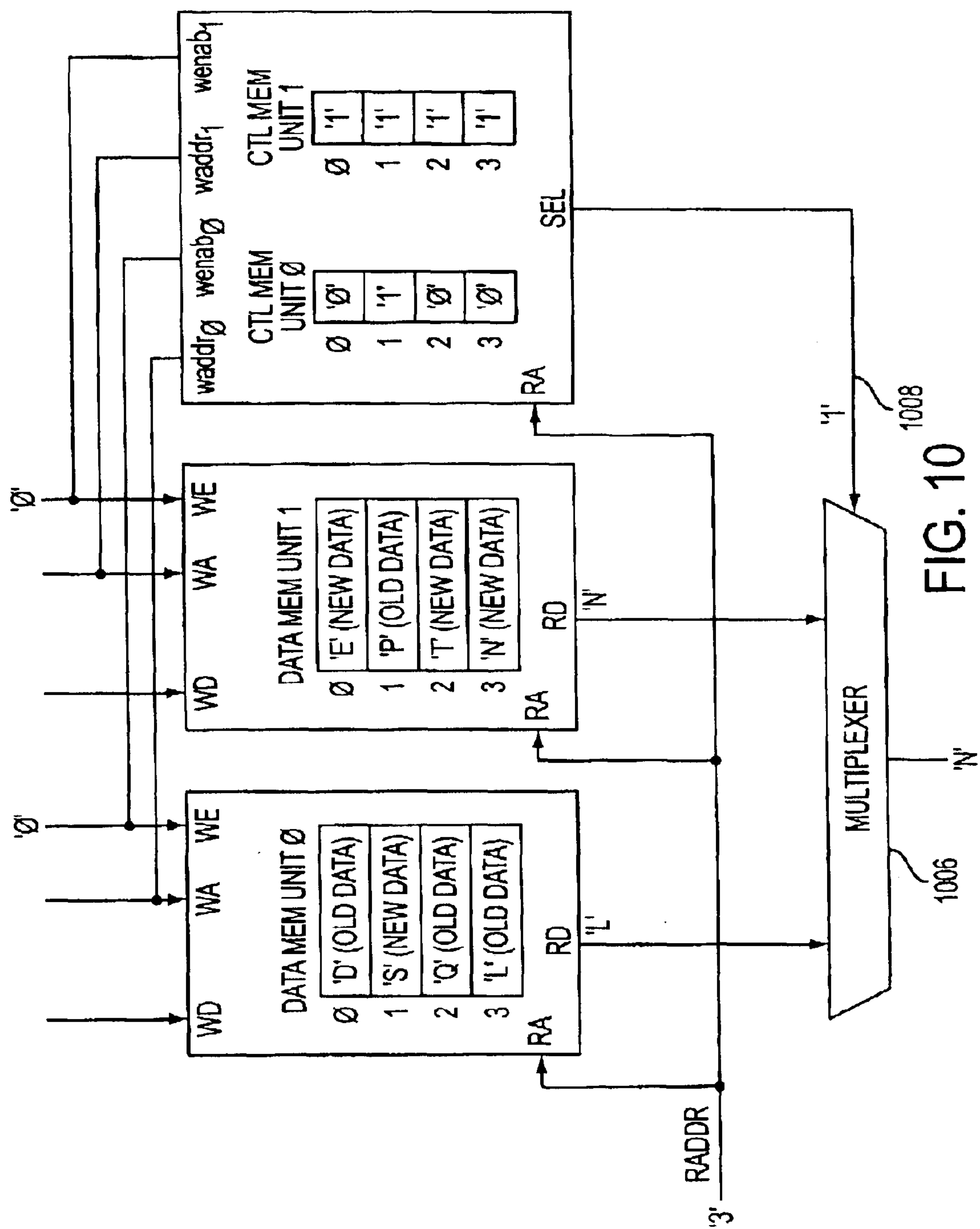

In response to the assertion of a clock signal, the memory updates its state to produce the state shown in FIG. 10. A value 'S' has been written into data memory unit '0' at location '1' and a value 'N' has been written into data memory unit '1' at location '3.' Further, a '1' has been written into control memory unit '0' at address '1.' Since a '1' value previously existed at that location, the control unit will continue to indicate that the most recently written data value for address '1' resides in data memory unit '0' (i.e. the new value 'S'). As an additional response to the clock signal, a '1' has been written into control memory unit '1' at address '3.' This updated value produces a '1' value for the select signal 1008 driven from the control unit. The multiplexer 1006 selects the value 'N' as the output of the entire memory, reflecting the fact that data memory unit '1' holds the most recently written value for location '3.'

The examples of FIGS. 1–10 make a number of exemplary assumptions: (1) That the read ports of the component memory devices are asynchronous, (2) that valid write addresses are available relatively early in the clock cycle used to operate the memory, in time to do a read by the end of the cycle, (3) that every location written in a given clock cycle can be read with new data that very same cycle, and (4) that writing to the same address during the same cycle from multiple write ports is an undefined operation. Those skilled in the art will appreciate that to the extent any or all of the assumptions do not apply, appropriate modifications to the exemplary embodiments described herein may be necessary.

Figure 11:
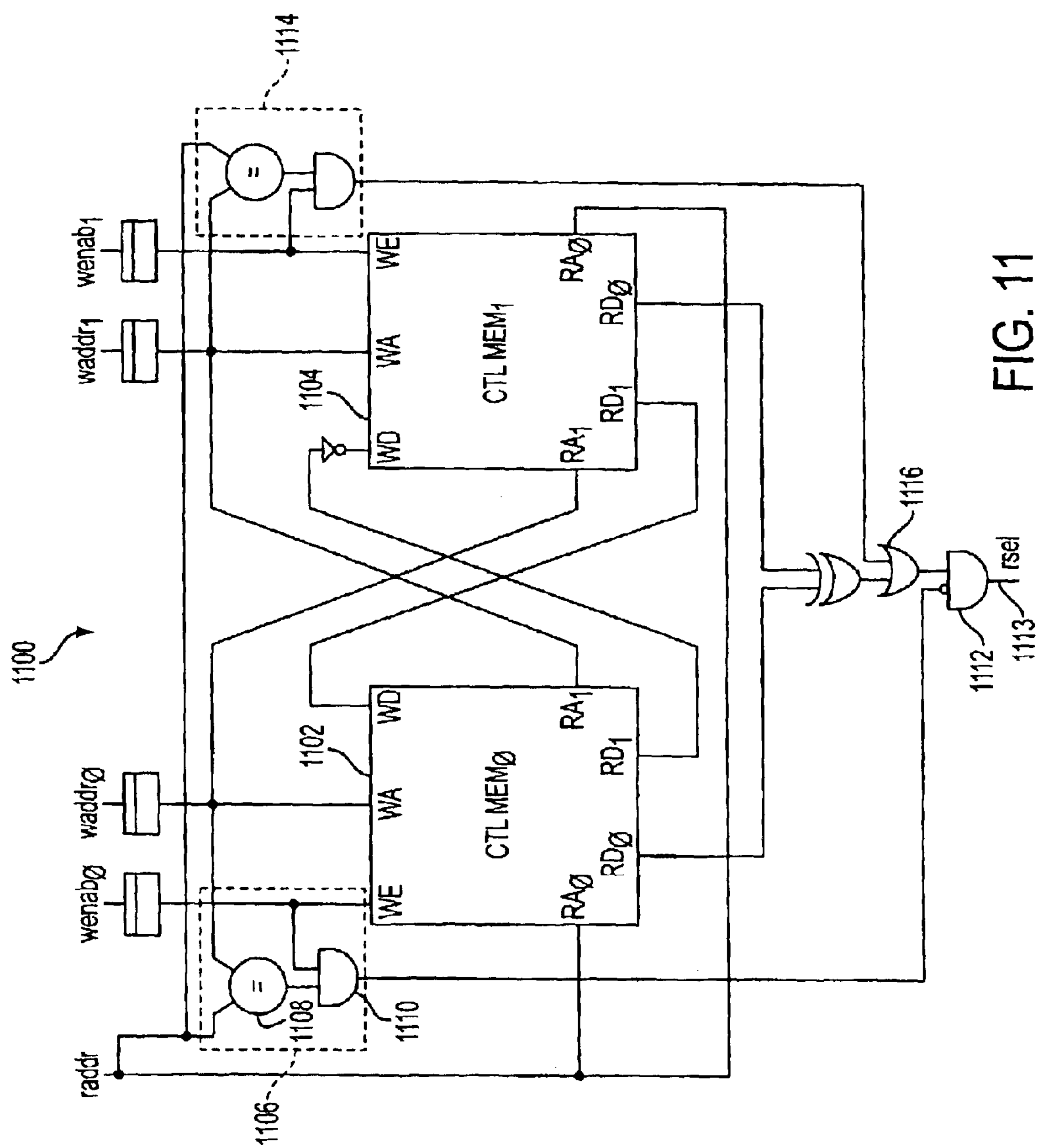
FIG. 11 is a diagram that illustrates an exemplary control unit adapted for late-cycle write addresses.

FIG. 11 illustrates a control memory unit 1100 used in an exemplary embodiment of the present invention in which case the write addresses become valid only late in the clock cycle. Since the write addresses are available late in the cycle, there remains the possibility that the control memory units 1102 and 1104 of the control unit 1100 have not been updated to reflect the most recent write operation and a select unit output based on this stale control memory unit state would be incorrect. To avoid this situation, logic can be added to the control unit 1100. In the exemplary embodiment of FIG. 11, logic 1106 includes a comparator 1108 and an AND unit 1110. The logic 1106 indicates whether the current read address is the same as the write address for an enabled write on port '0' presented during the last cycle. If so, a signal is sent to the logic 1112 line to indicate a '0' on the output selective signal 1113, meaning that the data memory unit '0' contains the most recent version of the data. Similarly, logic 1114 checks whether the current read address is the same as the write address for an enabled write on port '1' presented during the last cycle. If so, a signal is sent to the OR unit 1116 to cause the output selective signal 1113 to be a '1,' indicating the data memory unit '1.'

Figure 12:
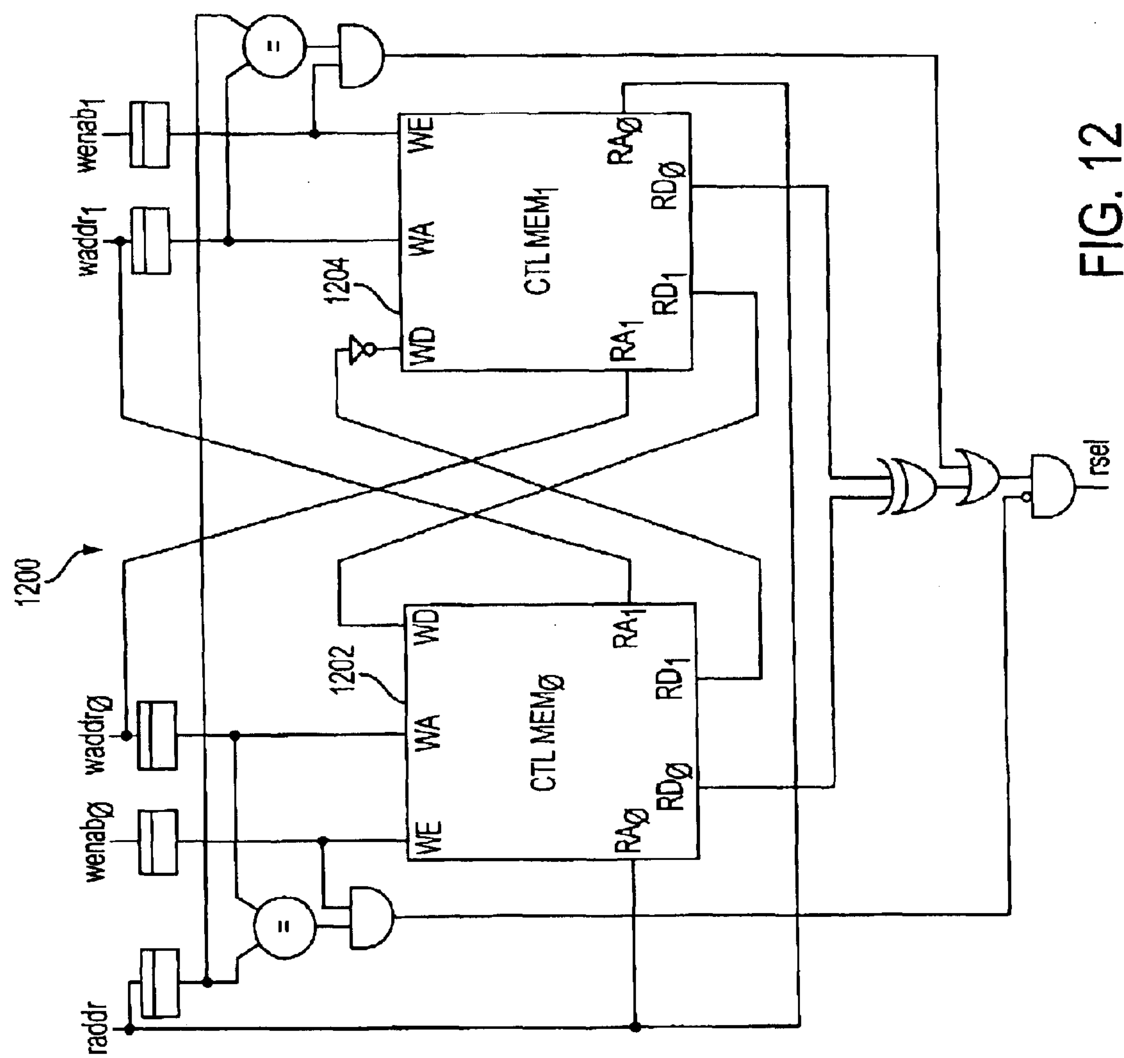
FIG. 12 is a diagram that illustrates an exemplary control unit adapted for synchronous read memories.

FIG. 12 illustrates an exemplary embodiment in which the control unit 1200 is adapted for operation with synchronous read memories. Since the synchronous read aspect delays the reading and hence the updating of the control memory unit state, there remains the possibility that a select unit output based on this stale control memory unit state would be incorrect. To avoid this situation, logic similar to that seen in FIG. 11 is added to the control unit 1200 of FIG. 12. In the synchronous read example, the read address is latched based on a clock and the read data delivered in the next cycle. In the exemplary embodiment of FIG. 12, the delayed version of the read address is compared with the delayed version of each of the write addresses. If there is a match and the write is enabled, the selective signal is forced to a value that indicates which write port is performing the matching write operation. By using a latch for the read address, the synchronous read memories are adapted for the system of the present invention. In addition, the primary input write addresses, and not a latched version of same, are connected to the control memory unit read address inputs. The control memory units are implemented with synchronous read memories and thus already have a latch at their read address inputs.

Figure 13:
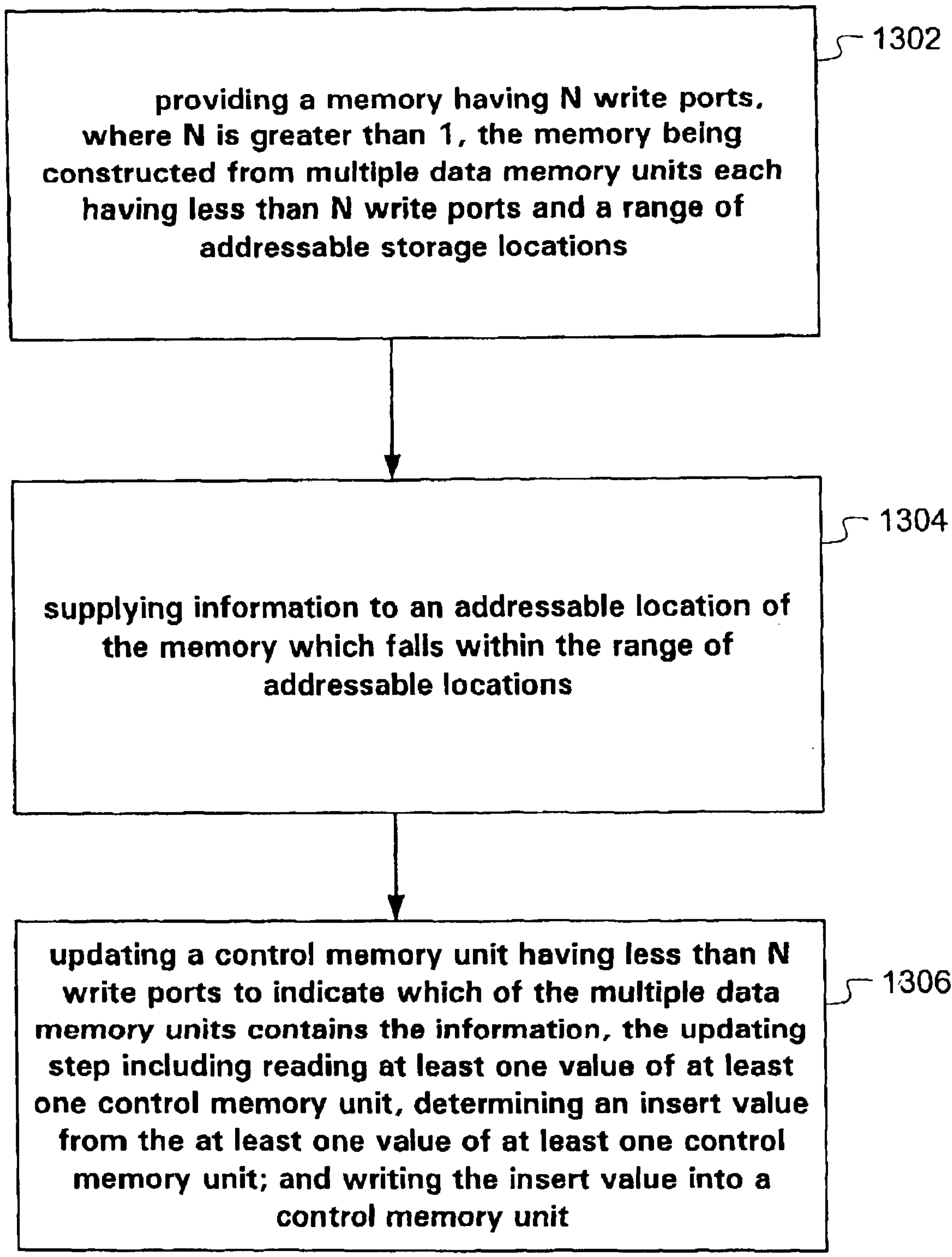
FIG. 13 is a flow chart that illustrates a method of an exemplary embodiment of the present invention.

FIG. 13 is a flow chart that illustrates a method of an exemplary embodiment of the present invention. In step 1302, a memory is provided having N write ports, where N is greater than 1. The memory includes multiple data memory units each having less than N write ports and a range of addressable storage locations.

In step 1304, information is supplied to an addressable location of the memory which falls within the range of addressable locations. In step 1306, a control memory unit having less than N write ports is updated to indicate which of the multiple data memory units contains the information. The updating of the control memory unit including reading at least one value of at least one control memory unit, determining an insert value from the at least one value of at least one control memory unit; and writing the insert value into a control memory unit.

The method can include sending a read command and an associated address to the memory, retrieving a first value from each of the multiple data memory units; and selecting one of the first values to provide a current value.

Figure 14:
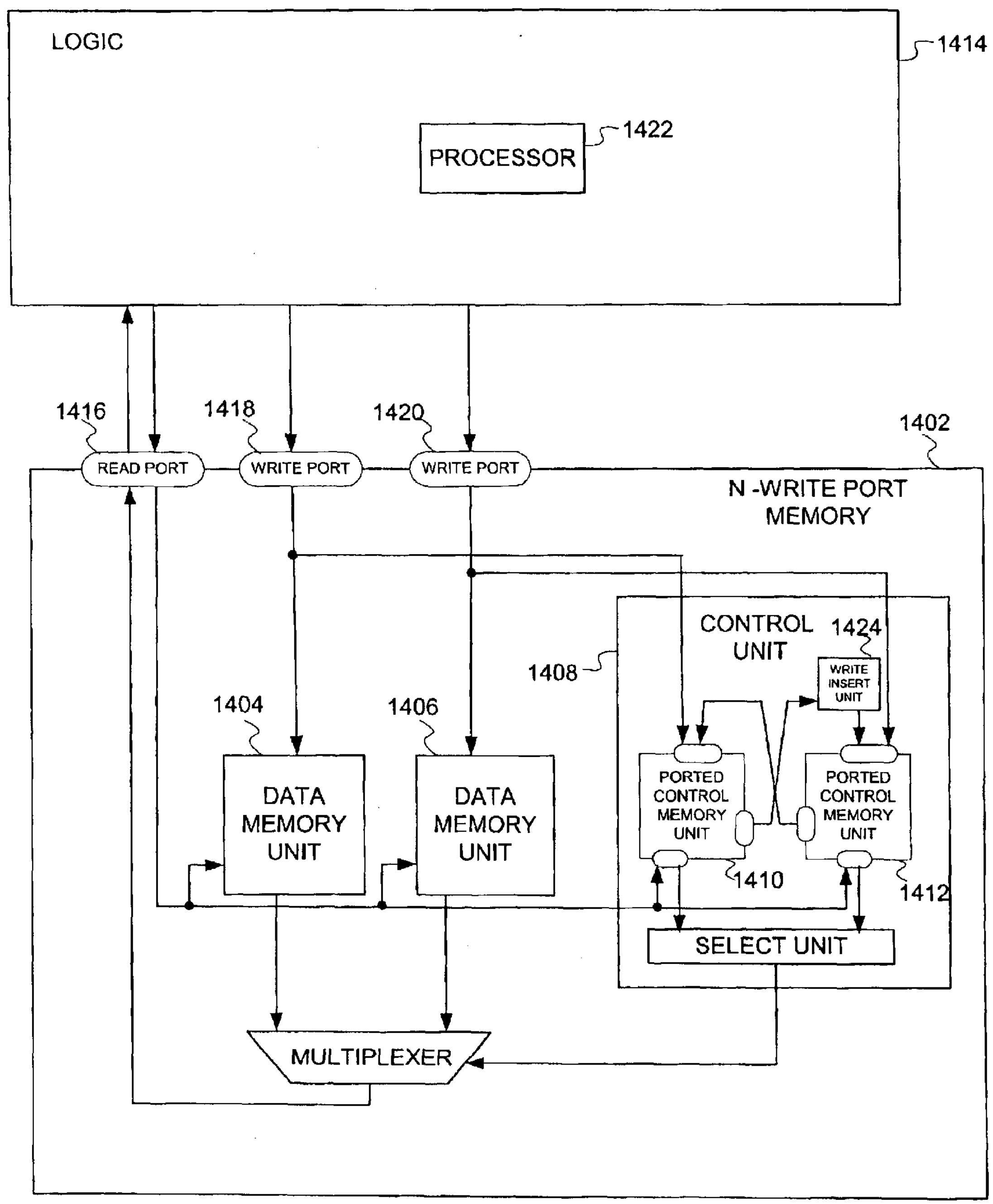
FIG. 14 is a diagram of an exemplary embodiment of a system including a memory constructed of multiple data memory units and a control unit.

FIG. 14 is a diagram of an exemplary embodiment of a system 1400 including a memory 1402 constructed of multiple data memory units 1404 and 1406 and a control unit 1408. The memory 1402 has N write ports, wherein N is greater than 1. The memory 1402 includes a first data memory unit 1404 having a plurality of storage locations addressable by a range of addresses, and having less than N write ports. The memory 1402 includes a second data memory unit 1406 having a plurality of storage locations addressable by the range of addresses. The second data memory unit 1406 has less than N write ports. The memory 1402 includes a control unit 1408 configured to select among the first data memory unit and the second data memory unit in response to a read command having an associated read address which falls within the address range. The control unit includes multiple control memory units 1410 and 1412. Each control memory unit 1410 and 1412 has less than N write ports. The control unit 1408 comprises at least one write-insert unit 1424 producing insert data for one of the control memory units 1412. The at least one write-insert unit 1424 receives read data from at least one other control memory unit 1410.

The system 1400 also includes logic 1414 configured to access the memory 1402. In the example of FIG. 14, the logic 1414 accesses the memory using read port 1416 and write ports 1418 and 1420.

The logic 1414 can include a processor 1402. The processor 1422 can be part or all of the logic 1414.

The logic 1414 and the memory 1402 can be on a single chip. This chip can be a reconfigurable logic chip or another type of chip such as an ASIC.

The logic 1414 and the memory 1402 can be on different chips. In one embodiment, the logic 1414 comprises a processor chip and the memory 1402 is part of a separate chip, such as a reconfigurable logic chip or an ASIC.

The following paragraphs describe an example of a parameterized system of the present invention. In this description, a memory that has R read ports and W write ports will be termed a Mem(R,W). Such a memory can be a component memory from a design library or constructed from such memories.

Exemplary Structural Description of the Read-Modify-Write CtlUnit(R.W.X)

A control unit that operates within an exemplary memory of the present invention that has R read ports, X data memory units where each data memory unit has W write ports will be terms a CtlUnit(R,W,X). To formally define the signals that enter or leave the CtlUnit(R,W,X) component:

- W*X write address inputs, named $waddr_{x,w}$ where $x \in \{0,1, \ldots, X-1\}$ and $w \in \{0,1, \ldots W-1\}$. $waddr_{x,w}$ is the $w^{th}$ write address connected to data memory unit x.
- W*X write enable inputs, named $wenab_{x,w}$ where $x \in \{0,1, \ldots, X-1\}$ and $w \in \{0,1, \ldots W-1\}$. $wenab_{x,w}$ is the $w^{th}$ write enable connected to data memory unit x.
- R read address inputs, named $raddr_{x,w}$ where $r \in \{0,1, \ldots, R-1\}$ $raddr_r$ is the $r^{th}$ read address connected to the constructed higher-ported memory.
- R read select outputs, named $rsel_r$ where $r \in \{0,1, \ldots, R-1\}$. Each $rsel_r$ output has a width N needed to represent X different states. Assuming an encoded binary representation, $N=\lceil \log_2(X) \rceil$. Alternatively, assuming a decoded "one-hot" representation, N=X. This data-representation dependent value N will be referenced in the descriptions that follow.

In addition, the number and names of the implementation components are:

- X*W Exclusive-OR units named $WriteInsert_{x,w}$ where $x \in \{0,1 \ldots ,X-1\}$ and $w \in \{0,1, \ldots, W-1\}$, and where each $WriteInsert_{x,w}$ has X inputs and 1 output, all of width N.
- R Exclusive-OR units named $ReadSelect_r$ where $r \in \{0,1, \ldots, R-1\}$ and where each $ReadSelect_{x,w}$ has X inputs and 1 output, all of width N.
- X memories of the type Mem(R+(X−1)*W,W) named $CtlMem_x$ where $x \in \{0,1, \ldots, X-1\}$ and where the connection points (a.k.a. "pins") of each $CtlMem_x$ shall be named as follows:
- W write address inputs, named $WA_w$ where $w \in \{0,1, \ldots, W-1\}$
- W write enable inputs, named $WE_w$ where $w \in \{0,1, \ldots, W-1\}$ each of width 1
- W write data inputs, named $WD_w$ where $w \in \{0,1, \ldots, W-1\}$ each of width N
- R+(X−1)*W read address inputs, named $RA_r$ where $r \in \{0, 1, \ldots, R+(X-1)*W-1\}$
- R+(X−1)*W read data outputs, named $RD_r$ where $r \in \{0,1, \ldots, R+(X-1)*W-1\}$, each of width N.

Given now this naming of signals and components, the component-to-component connections are:

As shown in FIG. 7, the $rsel_r$ output signal 718, for each $r \in \{0,1, \ldots, R-1\}$, is generated through the following connections:

- the $raddr_r$ input signal 702 is connected to the $RA_r$ input pin of all X CtlMems, including the CtlMems 704, 706 and 708.
- the $RD_r$ output pins of all X CtlMems are connected to the X inputs of the $ReadSelect_r$ Exclusive-OR unit 716, by means of X read data signals including signals 710, 712 and 714.
- The $ReadSelect_r$ Exclusive-OR unit 716 output is connected to the $rsel_r$ output signal 718.

As shown in FIG. 8, the signal driving the $WD_w$ input of $CtlMem_x$ 812, for each $x \in \{0,1, \ldots, X-1\}$ and $w \in \{0,1, \ldots, W-1\}$, is generated through the following connections:

- the $wenab_{x,w}$ input signal 816 is connected to the $WE_w$ input pin of $CtlMem_x$ 812.
- the $waddr_{x,w}$ input signal 814 is connected to the $WA_w$ input pin of $CtlMem_x$ 812.
- the $waddr_{x,w}$ input signal 814 is also connected to the $RA_m$ input pin of $CtlMem_i$ for all $i \in \{0,1, \ldots, x-1\}$, including CtlMems 804 and 806. The corresponding $RD_m$ output pin of each such $CtlMem_i$ is connected to an input of $WriteInsert_{x,w}$ 802. Since each read port of the CtlMems functions identically, the choice of the read port number m is arbitrary. However, one approach that assigns port numbers without conflict is to have m=R+(x−1)*W+w.
- the $waddr_{x,w}$ input signal 814 is also connected to the $RA_n$ input pin of $CtlMem_i$ for all $i \in \{x+1, x+2, \ldots, X-1\}$, including CtlMems 808 and 810. The corresponding $RD_n$ output pin of each such $CtlMem_i$ is connected to an input of $WriteInsert_{x,w}$ 802. Since each read port of the CtlMems functions identically, the choice of the read port number n is arbitrary. However, one approach that assigns port numbers without conflict is to have n=R+x*W+w.

the constant value 'x' is connected to an input of $WriteInsert_{x,w}$ 802. The N-bit 'x' value representation should be the same as the rsel value that indicates that $DataMem_x$ is the most recently written.

The output of $WriteInsert_{x,w}$ 802 is connected to the $WD_w$ input of $CtlMem_x$ 812.

Functional Description of the Read-Modify-Write CtlUnit (R,W,X)

This description provides an operational description of the Read-Modify-Write CtlUnit (R,W,X) and explains in more mathematical terms the function of the components described previously in the structural description. Refer to that description for a complete definition of signals and components, but recall that a Read-Modify-Write CtlUnit (R,W,X) consists of X*W $WriteInsert_{x,w}$ components, R $ReadSelect_r$ components, and X $CtlMem_x$ components. In the following description, the memory contents of location A of $CtlMem_x$ will be designated $CtlMem_x[A]$.

The function of the CtlUnit(R,W,X) is to retain the knowledge of which data memory unit holds the most recently written value for each addressed location of the more-capable constructed memory. If location A was last written from a write port of data memory unit 'x', then, after the CtlMem state has been updated, the Exclusive-OR of all X $CtlMem_i[A]$ values will equal 'x'. In equation form, where the Exclusive-OR function shall be denoted by the symbol ⊕, we have:

$$x=CtlMem_0[A]\oplus CtlMem_1[A]\oplus \ldots \oplus CtlMem_{x-1}[A]$$

It is the function of the $ReadSelect_r$ component to perform this calculation for read port r of the constructed memory. Recalling that the read address of the read port r is named $raddr_r$ and that the most recently written memory is indicated by the $rsel_r$ output of the control unit, the $ReadSelect_r$ component calculates the value:

$$rsel_r=CtlMem_0[raddr_r]\oplus CtlMem_1[raddr_r]\oplus \ldots \oplus CtlMem_{x-1}[raddr_r]$$

Examining now the problem of maintaining the control memory state in the presence of writes to the data memory units, consider the scenario that location A is written from a write-port of data memory unit 'x'. As an advantage of the invention, only the $CtlMem_x$ memory need be written as part of the control unit state update process. The challenge of the design is to determine a new value for $CtlMem_x[A]$, such that then:

$$x=CtlMem_0[A]\oplus CtlMem_1[A]\oplus \ldots \oplus CtlMem_{x-1}[A]$$

Using the identity z⊕z=0 for any z, the above equation can be manipulated to the form:

$$CtlMem_x[A]=CtlMem_0[A]\oplus \ldots \oplus CtlMem_{x-1}[A]\oplus x\oplus$$

$$CtlMem_{x+1}[A]\oplus \ldots \oplus CtlMem_{x-1}[A]$$

Operationally, this new value for $CtlMem_x[A]$is calculated by first reading all X−1 $CtlMem_i[A]$ values (for all i other than i=x) and then Exclusive-ORing the constant 'x'. For write port 'w' of the data memory unit 'x', it is the function of the control unit's $WriteInsert_{x,w}$ component to calculate the appropriate value as per the above equation. Let the output signal of the $WriteInsert_{x,w}$ component be named $wdata_{x,w}$. Recalling that the write address of write port 'w' of data memory unit x' is named $waddr_{x,w}$ then the $WriteInsert_x$ component calculates the value:

$$wdata_{x,w}=CtlMem_0[waddr_{x,w}]\oplus \ldots \oplus CtlMem_{x-1}[waddr_{x,w}]\oplus x\oplus$$

$$CtlMem_{x+1}[waddr_{x,w}]\oplus \ldots \oplus CtlMem_{x-1}[waddr_{x,w}]$$

Once this value is calculated, a write operation is performed on $CtlMem_x$, effectively performing the assignment:

$$CtlMem_x[waddr_{x,w}]=wdata_{x,w}$$

Note that the representation of values on the $rsel_r$ signal, the $wdata_{x,w}$ signal, the $CtlMem_i$ contents and the literal value 'x' referred to above are all consistent, but are otherwise implementation dependent. For example, assuming an encoded binary representation, the bit width of these values would be $N=\lceil \log_2(X)\rceil$. Alternatively, assuming a decoded "one-hot" representation, the bit width of these values would be N=X. The principles of this invention are independent of the particular data representation chosen.

While there has been described what are believed to be the preferred embodiments of the present invention, those skilled in the art will recognize that other and further changes and modifications may be made thereto without departing from the spirit of the invention which is defined by the appended claims, and it is intended to claim all such changes and modifications as fall within the true scope of the invention. The presently disclosed embodiments are therefore considered in all respects to be illustrative and not restricted. The scope of the invention described by the foregoing includes all changes that come within the meaning, range and equivalence thereof and is intended to be embraced therein.

What is claimed is:

1. A memory having N write ports, wherein N is greater than 1, comprising:

a first data memory unit having a plurality of storage locations addressable by a range of addresses, and having less than N write ports;

a second data memory unit having a plurality of storage locations addressable by the range of addresses, the second data memory unit having less than N write ports; and a control unit configured to select among the first data memory unit and the second data memory unit in response to a read command having an associated read address which falls within the address range, the control unit including multiple control memory units, each having less than N write ports, the control unit comprising at least one write-insert unit producing insert data for one of the control memory units, the at least one write-insert unit receiving read data from at least one other control memory unit.

2. The memory of claim 1, wherein the write-insert unit produces insert data such that a select unit receiving data from each control memory unit for an address will indicate a data memory unit.

3. The memory of claim 2, wherein the select unit includes Exclusive-OR logic.

4. The memory of claim 1, wherein the write insert unit uses Exclusive-OR logic.

5. The memory of claim 4, wherein the Exclusive-OR logic of the write insert unit receives read data from each of the control memory units other than the control memory unit to which the write insert unit output is connected.

6. The memory of claim 5, wherein an identifier constant value is also provided to the Exclusive-OR logic of the write insert unit.

7. The memory of claim 1, comprising a multiplexer coupled with the first data memory unit and the second data memory unit, the multiplexer configured to receive a select memory signal from the control unit and to produce read data for the memory.

8. The memory of claim 1, wherein the control unit is operably connected to the N write ports to receive write addresses provided to the memory.

9. The memory of claim 8, wherein each control memory unit is associated with a data memory unit of the memory.

10. The memory of claim 1, wherein the control unit comprises two control memory units and wherein the control unit has a single write-insert unit which is an inverter.

11. The memory of claim 1, wherein the insert data is stored in the one of the control memory units and is used by the control unit to determine how to select among the first and second data memory units.

12. The memory of claim 1, wherein the control unit comprises at least one select unit receiving read data from the control memory units at the associated read address, the at least one select unit producing a select memory signal.

13. The memory of claim 1, wherein the memory has more than one read port and the control unit has a select unit associated with each read port.

14. The memory of claim 1, comprising at least one additional data memory unit wherein the control unit is adapted to select between the first data memory unit, the second data memory unit and the at least one additional data memory unit.

15. A method for operating a memory comprising:

providing a memory having N write ports, where N is greater than 1, the memory being constructed from multiple data memory units each having less than N write ports and a range of addressable storage locations;

supplying information to an addressable location of the memory which falls within the range of addressable locations; and updating a control memory unit having less than N write ports to indicate which of the multiple data memory units contains the information, the updating step including reading at least one value of at least one control memory unit, determining an insert value from the at least one value of at least one control memory unit; and writing the insert value into a control memory unit.

16. The method of claim 15, comprising:

sending a read command and an associated address to the memory;

retrieving a first value from each of the multiple data memory units; and selecting one of the first values to provide a current value.

17. A control unit for a memory having N write ports where N is greater than 1 comprising:

a number of control memory units, each control memory unit having less than N write ports;

at least one write-insert unit producing insert data for one of the control memory units, the at least one write-insert unit receiving data read from at least one other control memory unit; and at least one select unit receiving read data from the control memory units at a read address provided to the memory, the at least one select unit producing an indication of a data memory unit.

18. The control unit of claim 17, wherein the insert data is stored in the one of the control memory units and is used by the at least one select unit to determine how to select among the first and second data memory units.

19. The memory of claim 18, wherein the select unit comprises at least one Exclusive-OR unit.

20. The control unit of claim 17 wherein the control unit comprises two control memory units and wherein the control unit has a single write-insert unit which is an inverter.

21. The control unit of claim 17, comprising multiple select units, each select unit associated with a read port of the memory.

22. A System including a memory comprising:

the memory having N write ports, wherein N is greater than 1, the memory including a first data memory unit having a plurality of storage locations addressable by a range of addresses, and having less than N write ports, a second data memory unit having a plurality of storage locations addressable by the range of addresses, the second data memory unit having less than N write ports, the memory having a control unit configured to select among the first data memory unit and the second data memory unit in response to a read command having an associated read address which falls within the address range, the control unit including multiple control memory units, each having less than N write ports, the control unit comprising at least one write-insert unit producing insert data for one of the control memory units, the at least one write-insert unit receiving read data from at least one other control memory unit; and logic configured to access the memory.

23. The control unit of claim 22, wherein the logic includes a processor.

24. The control unit of claim 22, wherein the logic and the memory are on a single chip.

25. The control unit of claim 24, wherein the chip is a reconfigurable logic chip.

26. The control unit of claim 22, wherein the logic and the memory are on different chips.

* * * * *